United States Patent [19]

Suzuki et al.

[11] Patent Number: 4,810,908
[45] Date of Patent: Mar. 7, 1989

[54] SEMICONDUCTOR LOGIC CIRCUIT COMPRISING CLOCK DRIVER AND CLOCKED LOGIC CIRCUIT

[76] Inventors: Hirokazu Suzuki, 7-9-2, Oshizawadai, Kasugai-shi, Aichi, 487; Akinori Tahara, 7-15-25, Kotsubo, Zushi-shi, Kanagawa, 249; Shinji Saito, 6-2-3-10-408, Iwanaridai, Kasugai-shi, Aichi, 489, all of Japan

[21] Appl. No.: 125,648

[22] Filed: Nov. 25, 1987

[30] Foreign Application Priority Data

Dec. 1, 1986 [JP] Japan .................................. 61-286509

[51] Int. Cl.$^4$ .......................................... H03K 19/086
[52] U.S. Cl. .................... 307/480; 307/455; 307/475; 307/471; 307/264; 307/269
[58] Field of Search ............... 307/454, 455, 456, 443, 307/467, 475, 355, 356, 358, 360, 264, 269, 272.1, 480, 471; 365/233

[56] References Cited

U.S. PATENT DOCUMENTS 4,408,134 10/1983 Allen ................................... 307/471
4,532,440 7/1985 Barre ................................... 307/455
4,551,639 11/1985 Takeda et al. ....................... 307/455
4,560,888 12/1985 Oida .............................. 307/443 X
4,563,600 1/1986 Kobayashi et al. ............. 307/475 X
4,700,087 10/1987 Stroberger ......................... 307/475
4,714,841 12/1987 Shoji et al. ..................... 307/475 X

FOREIGN PATENT DOCUMENTS 0234122 10/1986 Japan ................................. 307/454
2125646 3/1984 United Kingdom ............. 307/272.1

Primary Examiner—Stanley D. Miller
Assistant Examiner—M. R. Wambach
Attorney, Agent, or Firm—Armstrong, Nikaido, Marmelstein & Kubovcik

[57] ABSTRACT

A semiconductor logic circuit comprises a clock driver circuit and a clocked circuit which carries out a clocked operation responsive to an output of the clock driver circuit, where an output logic amplitude of the clock driver circuit is set to a value which is greater than an internal logic amplitude of the clocked circuit and is less than or equal to four times the internal logic amplitude of the clocked circuit.

9 Claims, 5 Drawing Sheets

FIG.3
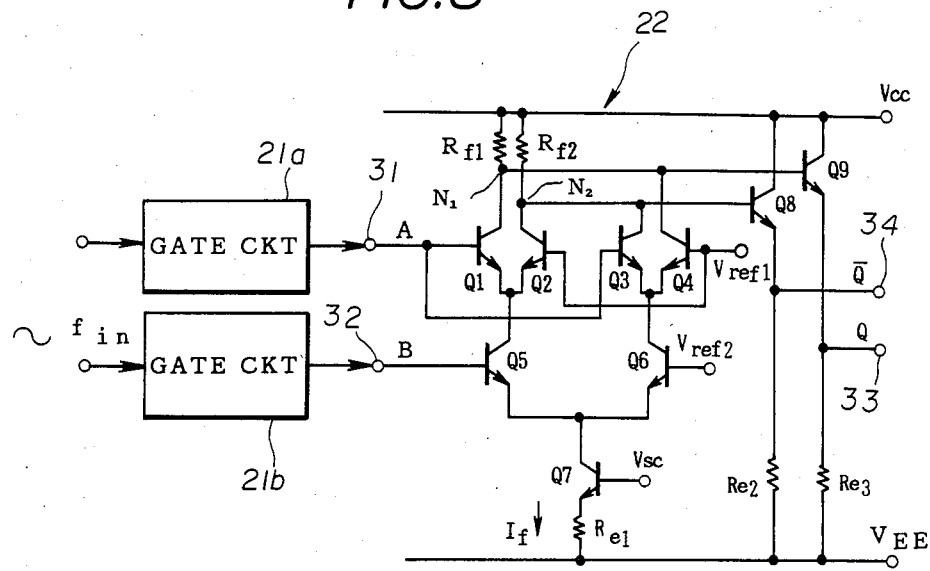
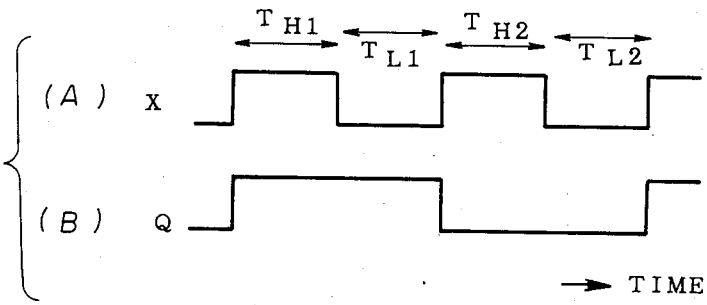
FIG.6

SEMICONDUCTOR LOGIC CIRCUIT COMPRISING CLOCK DRIVER AND CLOCKED LOGIC CIRCUIT

BACKGROUND OF THE INVENTION

The present invention generally relates to semiconductor logic circuits, and more particularly to a semiconductor logic circuit comprising a circuit such as a flip-flop circuit which carries out a clocked operation responsive to a clock pulse.

In a circuit such as a pre-scaler or the like which is applied with a high-frequency signal, there is a demand that the operating speed of the circuit is high as much as possible. For this reason, the high-frequency signal is amplified and shaped in a clock driver circuit and thereafter supplied to a flip-flop circuit.

FIG. 1 shows an example of a conventional semiconductor logic circuit. The semiconductor logic circuit comprises a clock driver circuit 11 and a flip-flop circuit 12. According to this circuit, it is possible to sufficiently drive the clock input to the flip-flop circuit 12 which is provided in a stage next to the clock driver circuit 11, because the high-frequency signal is amplified and shaped in the clock driver circuit 11. Accordingly, the flip-flop circuit 12 can operate at a high speed.

In the conventional semiconductor logic circuit, an output logic amplitude of the clock driver circuit 11 is desirably set to a large value in view of the noise margin, and is set to 800 mV, for example. An interval logic amplitude of the flip-flop circuit 12 is also set to 800 mV by considering the circuit matching with the clock driver circuit 11. However, recently, the clock driver circuit 11 and the flip-flop circuit 12 are built within a large scale integrated circuit, and the noise margin is improved. As a result, it has become possible to set the output logic amplitude of the clock driver circuit 11 to a value smaller than 800 mV. But in this case, the internal logic amplitude of the flip-flop circuit 12 is still set equal to the output logic amplitude of the clock driver circuit 11 by considering the circuit matching.

Therefore, in the conventional semiconductor logic circuit, there is a problem in that the speed of the clocked operation of the flip-flop circuit 12 cannot be further increased, since the internal logic amplitude of the flip-flop circuit 12 is set equal to the output logic amplitude of the clock driver circuit 11 by considering only the circuit matching.

SUMMARY OF THE INVENTION

Accordingly, it is a general object of the present invention to provide a novel and useful semiconductor logic circuit in which the problems described heretofore are eliminated.

Another and more specific object of the present invention is to provide a semiconductor logic circuit which can carry out a clocked operation at a speed higher than that of the conventional semiconductor logic circuit.

Still another object of the present invention is to provide a semiconductor logic circuit comprising a clock driver circuit and a clocked circuit which carries out a clocked operation responsive to an output of the clock driver circuit, where an output logic amplitude of the clock driver circuit is set to a value which is greater than an internal logic amplitude of the clocked circuit and is less than or equal to four times the internal logic amplitude of the clocked circuit. Particularly, it is most desirable that a ratio between the output logic amplitude of the clock driver circuit and the internal logic amplitude of the clocked circuit is set to approximately 2:1. According to the circuit of the present invention, it is possible to carry out the clocked operation at a speed higher than that of the conventional semiconductor logic circuit.

Other objects and further features of the present invention will be apparent from the following detailed description when read in conjunction with the accompanying drawings.

BRIEF DESCRIPTION OF THE DRAWINGS

FIG. 3 is a circuit diagram showing a first embodiment of the semiconductor logic circuit according to the present invention;

FIGS. 6(A) and 6(B) are time charts for explaining the operation of the second embodiment.

DETAILED DESCRIPTION

Figure 1:
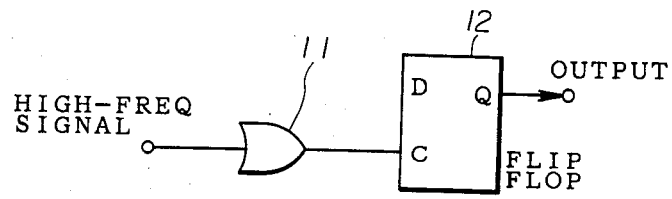
FIG. 1 is a block diagram showing an example of the conventional semiconductor logic circuit.
Figure 2:
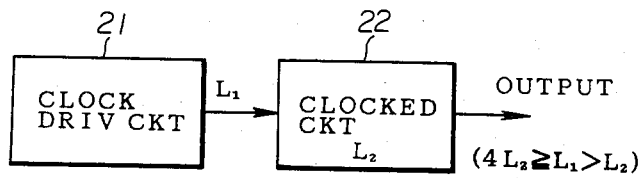
FIG. 2 is a block diagram for explaining the operating principle of the semiconductor logic circuit according to the present invention.

FIG. 2 is a block diagram for explaining the operating principle of the semiconductor logic circuit according to the present invention. In FIG. 2, the semiconductor logic circuit comprises a clock driver circuit 21 and a clocked circuit 22 which carries out a clocked operation responsive to an output of the clock driver circuit 21. An output logic amplitude $L_1$ of the clock driver circuit 21 is set to a value greater than an internal logic amplitude $L_2$ of the clocked circuit 22 and is less than or equal to $4L_2$. Particularly, a ratio between the amplitudes $L_1$ and $L_2$ is set to approximately 2:1. As will be described hereunder in conjunction with the embodiments, the clocked operation of the clocked circuit 22 becomes higher than that of the conventional semiconductor logic circuit because $4L_2 \geq L_1 < L_2$.

FIG. 3 shows a first embodiment of the semiconductor logic circuit according to the present invention. In FIG. 3, those parts which are the same as those corresponding parts in FIG. 2 are designated by the same reference numerals. The clocked circuit 22 in the present embodiment is an exclusive-OR circuit having an emitter coupled logic (ECL) construction. The clocked circuit 22 comprises transistors Q1 through Q9, and resistors $R_{f1}$, $R_{f2}$ and $R_{e1}$ through $R_{e3}$ which are connected as shown. In FIG. 3, $V_{CC}$ and $V_{EE}$ denote power source voltages, $V_{ref1}$ and $V_{ref2}$ denote reference voltages, $V_{SC}$ denotes a constant voltage for controlling the transistor Q7 which operates as a constant current source, and $f_{in}$ denotes a high-frequency signal which is applied to a second pre-stage gate circuit 21b which corresponds to the clock driver circuit. An input signal A is applied to a terminal 31 from a first pre-stage gate circuit 21a, and an output signal B of the second pre-stage gate circuit 21b is applied to a terminal 32. An output signal Q is obtained through a terminal 33, and an output signal $\overline{Q}$ is obtained through a terminal 34.

When both the input signals A and B have high levels, the transistors Q1, Q3 and Q5 are ON and the transistors Q2, Q4 and Q6 are OFF due to the setting of the reference voltages $V_{ref1}$ and $V_{ref2}$. Hence, out of a current $I_f$ from the transistor Q7 which operates as the constant current source, the current which passes through the resistor $R_{f1}$ flows through the transistors Q1 and Q5 thereby lowering the potential at a node $N_1$ and turning the transistor Q8 OFF, while the current which passes through the resistor $R_{f2}$ does not flow through the transistor Q6 thereby rising the potential at a node $N_2$ to a high level and turning the transistor Q9 ON. Accordingly, the output signal Q has a low level and the output signal $\overline{Q}$ has a high level.

When the input signal A has a low level and the input signal B has a high level, the transistors Q2, Q4 and Q6 are ON and the transistors Q1, Q3 and Q6 are OFF. Thus, out of the current $I_f$ from the transistor Q7, the current which passes through the resistor $R_{f1}$ turns the transistor Q8 ON while the current which passes through the resistor $R_{f2}$ flows through the transistors Q2 and Q5 thereby turning the transistor Q9 OFF. Accordingly, the output signal Q has a high level and the output signal $\overline{Q}$ has a low level.

Similarly, when both the input signals A and B have low levels, the transistors Q2, Q4 and Q6 are ON and the transistors Q1, Q3 and Q5 are OFF. As a result, the output signal Q has a low level and the output signal $\overline{Q}$ has a high level.

In addition, when the input signal A has a high level and the input signal B has a low level, the transistors Q1, Q3 and Q6 are ON and the transistors Q2, Q4 and Q5 are OFF. Hence, the output signal Q has a high level and the output signal $\overline{Q}$ has a low level.

Therefore, the clocked circuit 22 of the present embodiment operates as an exclusive-OR (exclusive-NOR) circuit. In the present embodiment, a ratio between the output logic amplitude of the second pre-stage gate circuit 21b (that is, the logic amplitude of the input signal B) and the internal logic amplitude of the clocked circuit 22 (that is, the logic amplitude of the nodes $N_1$ and $N_2$ or Q and $\overline{Q}$) is set to approximately 2:1. For example, when it is assumed that $R_{f1} = R_{f2} = R_f$, the internal logic amplitude of the clocked circuit 22 can be obtained from $I_f \times R_f$, and thus, the above ratio can be set to approximately 2:1 by appropriately selecting the values of the resistance $R_f$ and the constant voltage $V_{SC}$.

It is of course possible to provide a buffer circuit on the output side of the clocked circuit 22, so as to amplify the output logic amplitude of the clocked circuit 22 to the same amplitude as that of the second pre-stage gate circuit 21b.

Figure 4:
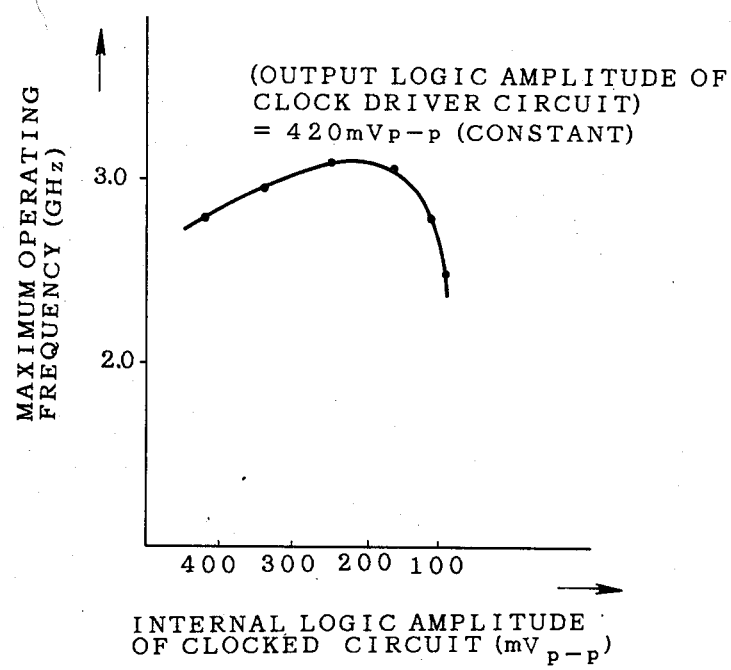
FIG. 4 is a graph showing simulation results of the embodiments for explaining the characteristics of the embodiments.

FIG. 4 plots simulation results showing a change in the maximum operating frequency obtained according to the circuit construction shown in FIG. 3 when the output logic amplitude of the second pre-stage gate circuit 21b which corresponds to the clock driver circuit is set to a constant value of 420 $mV_{p-p}$ and the internal logic amplitude of the clocked circuit 22 is varied. It may be seen from FIG. 4 that the maximum operating frequency increases in a predetermined region in which the output logic amplitude of the second pre-stage gate circuit 21b is greater than the internal logic amplitude of the clocked circuit 22 and is less than or equal to four times the internal logic amplitude of the clocked circuit 22. In addition, it is also seen that the maximum operating frequency is extremely high in a range in which the ratio between the output logic amplitude of the second pre-stage gate circuit 21b and the internal logic amplitude of the clocked circuit 22 is approximately 2:0.9 to 2:1.1.

In the case of the conventional exclusive-OR circuit having a construction similar to that of the clocked circuit 22 shown in FIG. 3, the operating speed of the circuit with respect to the input signal B is slow compared to that with respect to the input signal A. But according to the present embodiment, the operating speed with respect to the input signal B is also high because the above described ratio is set to approximately 2:1.

The effect of increasing the operating speed with respect to the input signal A is also obtained when a ratio between the logic amplitude of the input signal A and the internal logic amplitude of the clocked circuit 22 is set to approximately 2:1.

Figure 5:
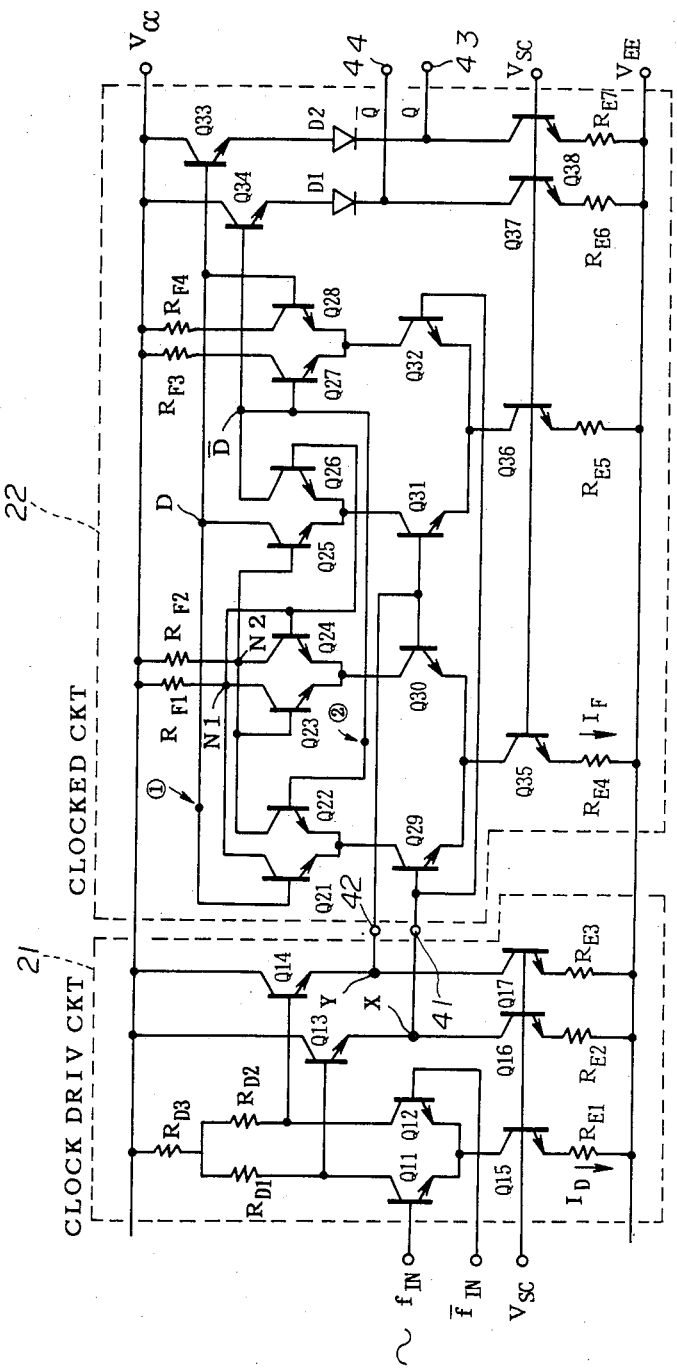
FIG. 5 is a circuit diagram showing a second embodiment of the semiconductor logic circuit according to the present invention.

FIG. 5 shows a second embodiment of the semiconductor logic circuit according to the present invention. In FIG. 5, those parts which are the same as those corresponding parts in FIG. 2 are designated by the same reference numerals. The clocked circuit 22 in the present embodiment is a flip-flop circuit having an ECL construction.

The clock driver circuit 21 as a pre-stage circuit comprises transistors Q11 through Q17 and resistors $R_{D1}$ through $R_{D3}$ and $R_{E1}$ through $R_{E3}$ which are connected as shown. The clocked circuit 22 comprises transistors Q21 through Q38, resistors $R_{F1}$ through $R_{F4}$ and $R_{E4}$ through $R_{E7}$, and diodes D1 and D2 which are connected as shown. In FIG. 5, $V_{CC}$ and $V_{EE}$ denote power source voltages, $V_{SC}$ denotes a constant voltage for controlling the transistors Q15 through Q17 and Q35 through Q38 which operates as constant current sources, $f_{IN}$ denotes a high-frequency signal which is applied to the clock driver circuit 21, and $\overline{f_{IN}}$ denotes an inverted signal of the high-frequency signal $f_{IN}$. An output signal X of the clock driver circuit 21 is applied to a terminal 41, and an output signal Y of the clock driver circuit 21 is applied to a terminal 42. The signal Y is an inverted signal of the signal X. An output signal Q of the clocked circuit (flip-flop circuit) 2 is obtained through a terminal 43, and an output signal $\overline{Q}$ which is an inverted signal of the signal Q is obtained through a terminal 44.

When it is assumed that the signals X and Y have a high level and a low level, respectively, and the signal level at nodes D and $\overline{D}$ are high and low, respectively, the transistors Q21, Q23, Q25, Q28, Q29, Q32 and Q33 are ON, and the transistors Q22, Q24, Q26, Q27, Q30, Q31 and Q34 are OFF. Accordingly, the output signals Q and $\overline{Q}$ have a high level and a low level, respectively. Thereafter, when the levels of the signals X and Y become low and high, respectively, the transistors Q29 and Q32 are turned OFF, and the transistors Q30 and Q31 are turned ON. Thus, the current passing through the node D flows through the transistors Q25 and Q31, and the current passing through the node $\overline{D}$ flows through the transistors Q23 and Q30. As a result, the transistors Q21 and Q28 are turned OFF. After a predetermined time elapses, the states of the transistors Q21 through Q34 become opposite to those in the initial state, and the levels of the output signals Q and $\overline{Q}$ become low and high, respectively.

FIGS. 6(A) and 6(B) show the operation timings of the clocked circuit 22 of the present embodiment. FIG. 6(A) shows the signal X and FIG. 6(B) shows the output signal Q. Since the signals Y and $\overline{Q}$ respectively are inverted signals of the signals X and Q, the illustration of the timings of the signals Y and $\overline{Q}$ will be omitted. As may be seen from FIGS. 6(A) and 6(B), a first circuit part comprising the transistors Q21, Q22, Q27 and Q28 writes the data at the nodes D and $\overline{D}$ and also outputs the data during a high-level period $T_{H1}$ of the signal X. During a low-level period $T_{L1}$ which immediately follows the high-level period $T_{H1}$, the first circuit part does not write in data, but a second circuit part comprising the transistors Q23, Q24, Q25 and Q6 holds the data at the nodes D and $\overline{D}$. Then, during a next high-level period $T_{H2}$ of the signal X, the first circuit part writes in the held data and also outputs the held data. During a low-level period $T_{L2}$ which immediately follows the high-level period $T_{H2}$, the first circuit part does not write in data, but the second circuit part holds the data at the nodes D and $\overline{D}$. Such operations are repeated, and the clocked circuit 22 outputs the signals Q and $\overline{Q}$ which have a frequency $\frac{1}{2}$ that of the signals X and Y.

According to the present embodiment, a ratio between the output logic amplitude of the clock driver circuit 21 (that is, the amplitude of the signal X at the terminal 41 and the signal Y at the terminal 42) and the internal logic amplitude of the clocked circuit 22 (that is, the signal amplitude at the nodes N1 and N2) is set to approximately 2:1. When it is assumed that $R_{D1}=R_{D2}=R_D$ and $R_{D3}$ is negligible, the output logic amplitude of the clock driver circuit 21 can substantially be obtained from $I_D \times R_D$. Hence, the above described ratio can be set to approximately 2:1 by appropriately selecting the values of the resistance $R_D$ and the constant voltage $V_{SC}$. On the other hand, when it is assumed that $R_{F1}=R_{F2}=R_F$, the internal logic amplitude of the clocked circuit 22 can substantially be obtained from $I_F \times R_F$. Thus, the above described ratio can also be set to approximately 2:1 by appropriately selecting the values of the resistance $R_F$ and the constant voltage $V_{SC}$.

In the present embodiment, the signals of the nodes D, $\overline{D}$ and Q, $\overline{Q}$ have the same amplitude as the input signal X for matching an amplitude of an external circuit. And the terminal 42 may be applied with a reference voltage like in the first embodiment.

When the output logic amplitude of the clock driver circuit 21 is set to a constant value of 420 $mV_{p-p}$ and the internal logic amplitude of the clocked circuit 22 is varied, simulation results showing a change in the maximum operating frequency obtained according to the circuit construction shown in FIG. 5 becomes similar to those shown in FIG. 4.

Figure 7:
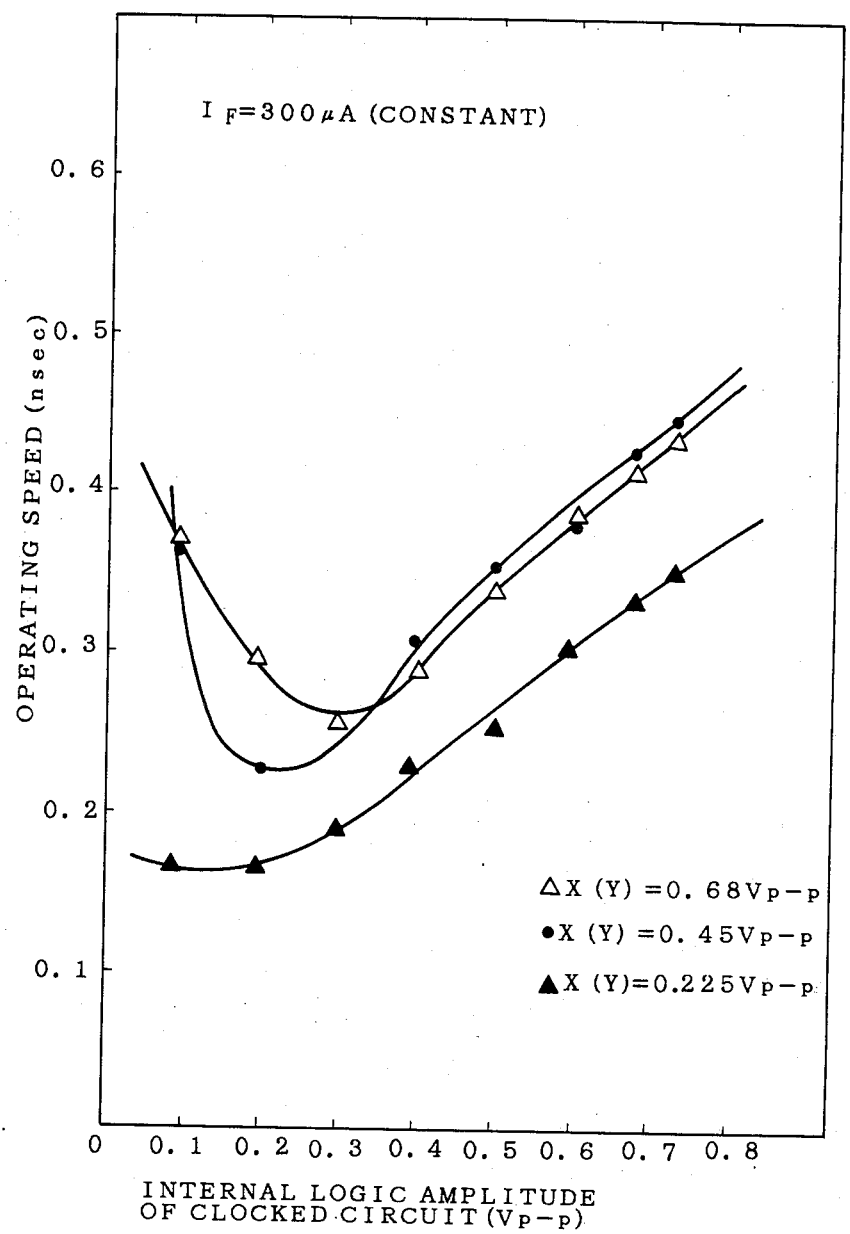
FIGS. 7 and 8 are graphs respectively showing simulation results of the second embodiment for explaining the characteristics of the second embodiment.

FIG. 7 plots simulation results showing a change in the operating speed obtained according to the circuit construction shown in FIG. 5 when the current $I_F$ is set to a constant current of 300 $\mu A$ and the internal logic amplitude of the clocked circuit 22 is varied. In FIG. 7, white triangular marks, black circular marks and black triangular marks respectively indicate data which are obtained when the output logic amplitude of the clock driver circuit 21 is 680 $mV_{p-p}$, 450 $mV_{p-p}$ and 225 $mV_{p-p}$.

Figure 8:
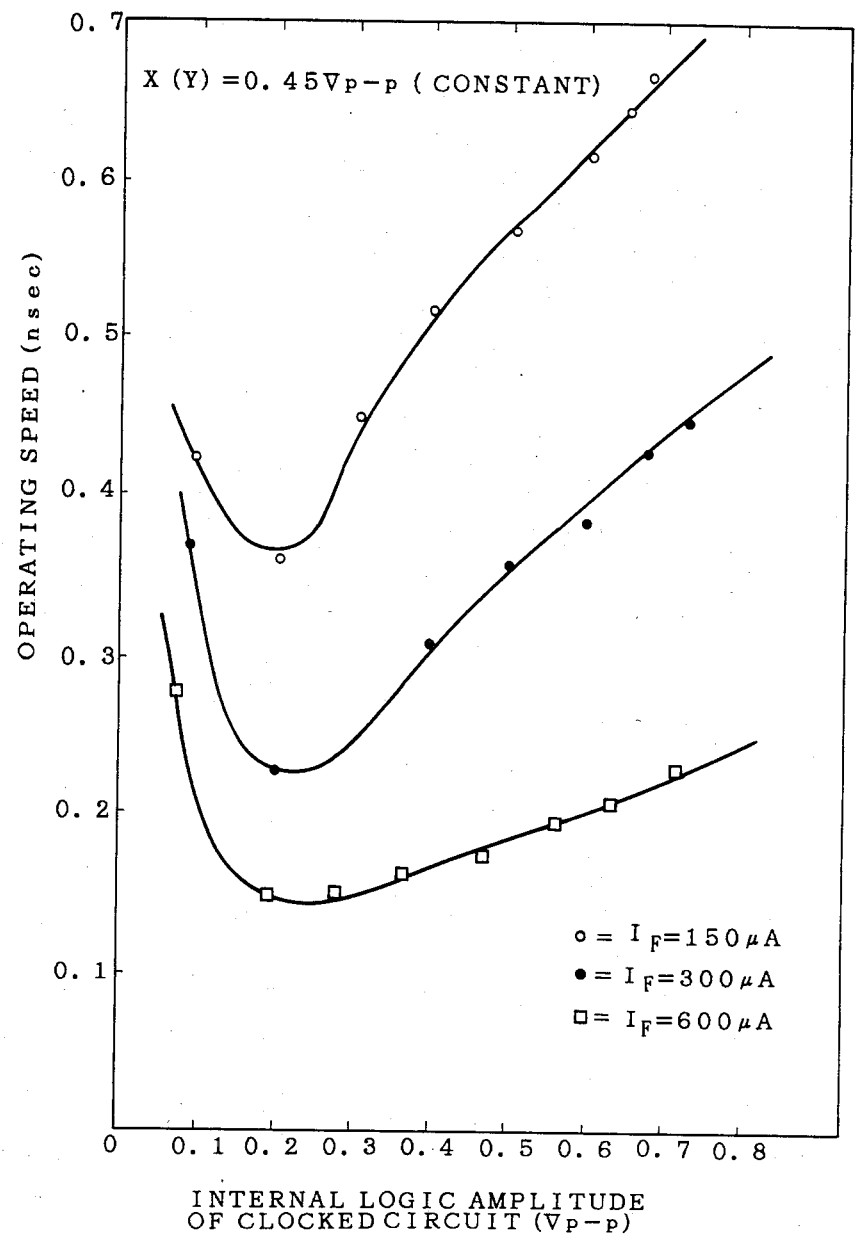

FIG. 8 plots simulation results showing a change in the operating speed obtained according to the circuit construction shown in FIG. 5 when the output logic amplitude of the clock driver circuit 21 is set to a constant amplitude of 450 $mV_{p-p}$ and the internal logic amplitude of the clocked circuit 22 is varied. In FIG. 8, white circular marks, black circular marks and white rectangular marks respectively indicate data which are obtained when the current $I_F$ is 150 $\mu A$, 300 $\mu A$ and 600 $\mu A$.

It may be seen from FIGS. 7 and 8 that the operating time becomes short and the operating speed increases in a predetermined region in which the output logic amplitude of the clock driver circuit 21 is greater than the internal logic amplitude of the clocked circuit 22 and is less than or equal to four times the internal logic amplitude of the clocked circuit 22. In addition, it is also seen that the operating speed is extremely high in a range in which the ratio between the output logic amplitude of the clock driver circuit 21 and the internal logic amplitude of the clocked circuit 22 is approximately 2:0.9 to 2:1.1.

In FIG. 5, it is of course to make disconnections in signal lines at positions 1 and 2 and use the bases of the transistors Q21 and Q22 as data input terminals of the clocked circuit 22.

According to the embodiments, the maximum operating frequency of the logic circuit can be made higher than that of the conventional logic circuit, by setting the ratio between the output logic amplitude of the clock driver circuit 21 and the internal logic amplitude of the clocked circuit 22 to approximately 2:1. Accordingly, the present invention is especially effective when used for a pre-scaler and the like which is applied with a high-frequency signal.

In the described embodiments, the clocked circuit is either an exclusive-OR (exclusive-NOR) circuit or a flip-flop circuit. However, the present invention is also applicable to other circuits which carries out a clocked operation at a high speed.

Further, the present invention is not limited to these embodiments, but various variations and modifications may be made without departing from the scope of the present invention.

What is claimed is:

1. A semiconductor logic circuit comprising:
   a clock driver circuit; and
   a clocked circuit for carrying out a clocked operation responsive to an output of said clock driver circuit,
   an output logic amplitude of said clock driver circuit being greater than an internal logic amplitude of said clocked circuit and less than or equal to four times the internal logic amplitude of said clocked circuit.

2. A semiconductor logic circuit as claimed in claim 1 in which a ratio between the output logic amplitude of said clock driver circuit and the internal logic amplitude of said clocked circuit is in a range of approximately 2:0.9 to 2:1.1.

3. A semiconductor logic circuit as claimed in claim 1 in which said clocked circuit is an exclusive-OR circuit, said clock driver circuit having an output terminal for outputting a logic signal to said exclusive-OR circuit.

4. A semiconductor logic circuit as claimed in claim 3 in which a ratio between the output logic amplitude of said clock driver circuit and the internal logic amplitude of said clocked circuit is in a range of approximately 2:0.9 to 2:1.1.

5. A semiconductor logic circuit as claimed in claim 1 in which said clocked circuit is flip-flop circuit.

6. A semiconductor logic circuit as claimed in claim 5 in which a ratio between the output logic amplitude of said clock driver circuit and the internal logic amplitude of said clocked circuit is in a range of approximately 2:0.9 to 2:1.1.

7. A semiconductor logic circuit as claimed in claim 1 in which said clocked circuit has an emitter coupled logic construction and comprises m first emitter-coupled transistors and n second emitter-coupled transistors, where m=2n, said first emitter-coupled transistors making n transistor pairs each having emitters thereof connected to collectors of corresponding ones of said second emitter-coupled transistors, the output of said clock driver circuit being applied to selected bases of said second emitter-coupled transistors, an output of said clocked circuit being obtained from selected collectors of said first emitter-coupled transistors.

8. A semiconductor logic circuit as claimed in claim 7 in which an input data is applied to selected bases of said first emitter-coupled transistors.

9. A semiconductor logic circuit as claimed in claim 7 in which said internal logic amplitude of said clocked circuit is a logic amplitude at the selected collectors of said first emitter-coupled transistors.

* * * * *

UNITED STATES PATENT AND TRADEMARK OFFICE
CERTIFICATE OF CORRECTION

PATENT NO. : 4,810,908

DATED : March 7, 1989

INVENTOR(S) : SUZUKI et al

It is certified that error appears in the above-identified patent and that said Letters Patent is hereby corrected as shown below:

On the cover page, after Item [76] insert

--[73] Assignees: Fujitsu Limited, Kawasaki; Fujitsu VLSI Limited, Aichi, both of Japan--.

Signed and Sealed this

Thirteenth Day of March, 1990

*Attest:*

JEFFREY M. SAMUELS

*Attesting Officer*   *Acting Commissioner of Patents and Trademarks*